(12) United States Patent
Spencer et al.

(10) Patent No.: US 10,176,886 B1
(45) Date of Patent: Jan. 8, 2019

(54) MULTI-LEVEL DATA BLOCK ERROR DETECTION CODE

(71) Applicant: Seagate Technology LLC, Cupertino, CA (US)

(72) Inventors: Thomas V. Spencer, Fort Collins, CO (US); Ryan James Goss, Prior Lake, MN (US); Mark A. Gaertner, Vadnais Heights, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/643,550

(22) Filed: Jul. 7, 2017

(51) Int. Cl.
*G06F 3/06* (2006.01)
*G06F 11/20* (2006.01)
*G06F 12/02* (2006.01)
*G06F 13/16* (2006.01)
*G11C 29/52* (2006.01)

(52) U.S. Cl.
CPC ............ *G11C 29/52* (2013.01); *G06F 3/0656* (2013.01); *G06F 3/0679* (2013.01); *G06F 11/2094* (2013.01); *G06F 12/0246* (2013.01); *G06F 13/1673* (2013.01)

(58) Field of Classification Search
CPC . G11C 29/52; G06F 12/0246; G06F 13/1673; G06F 3/0679; G06F 11/2094; G06F 3/0656; G06F 11/1004; H03M 13/09; H04L 1/0061; H04L 9/06

USPC .......................................................... 714/764
See application file for complete search history.

(56) References Cited

U.S. PATENT DOCUMENTS

| | | | |
|---|---|---|---|
| 5,826,015 A | 10/1998 | Schmidt | |
| 6,625,749 B1 | 9/2003 | Quach | |
| 6,802,039 B1 | 10/2004 | Quach et al. | |
| 7,752,505 B2 | 7/2010 | Gschwind et al. | |
| 7,836,378 B2* | 11/2010 | Shaeffer | G06F 11/1004 714/758 |
| 8,055,982 B2 | 11/2011 | Mulligan | |
| 9,218,240 B2* | 12/2015 | Chambers | H03M 13/6306 |
| 2008/0163007 A1* | 7/2008 | Shaeffer | G06F 11/1004 714/52 |
| 2008/0320375 A1* | 12/2008 | Hori | H04L 1/0061 714/807 |
| 2012/0079348 A1* | 3/2012 | Naeimi | G06F 11/1004 714/763 |
| 2015/0089332 A1* | 3/2015 | Chambers | H03M 13/6306 714/807 |

* cited by examiner

*Primary Examiner* — James C Kerveros
(74) *Attorney, Agent, or Firm* — Hall Estill Attorneys at Law

(57) ABSTRACT

A data storage system can consist of a number of data storage devices each having a non-volatile memory, a memory buffer, and an error detection module. The memory buffer may store a first data block comprising a front-end first-level error detection code assigned by the error detection module. The non-volatile memory can consist of a second data block having a back-end first-level error detection code and a second-level error detection code each assigned by the error detection module.

20 Claims, 3 Drawing Sheets

US 10,176,886 B1

MULTI-LEVEL DATA BLOCK ERROR DETECTION CODE

SUMMARY

A data storage system, in accordance with assorted embodiments, has a data storage device having a non-volatile memory, a memory buffer, and an error detection module. The memory buffer stores a first data block comprising a front-end first-level error detection code assigned by the error detection module. The non-volatile memory consists of a second data block having a back-end first-level error detection code and a second-level error detection code each assigned by the error detection module.

In some embodiments, a data storage device is activated having a non-volatile memory, a memory buffer, and an error detection module. A data block is stored in the memory buffer and a front-end first-level error detection code is assigned to the data block with the error detection module. The data block is with a compression circuit of the data storage device and encrypted with an encryption circuit of the data storage device. The compression and encryption of the front-end first-level error detection code creates a back-end first-level error detection code that is stored, along with the data block, in the non-volatile memory. The error detection module then assigns a second-level error detection code to the data block.

DETAILED DESCRIPTION

The proliferation of solid-state data storage, such as flash memory, has provided faster data access and smaller physical form factors than some other non-volatile data storage structures. However, solid-state data storage can suffer from performance bottlenecks that have impeded the broad-scale applicability and evolution into all data storage systems. For instance, data storage, like flash memory, cannot be over-written in-place and has a limited lifespan, which corresponds with a variety of maintenance and data access operations that have relatively high cost in terms of processing and execution time.

With these performance issues in mind, various embodiments are generally directed to data structures and performance schemes that intelligently track data into, and out of, non-volatile solid-state memory. It is noted that some embodiments will generally be directed to flash memory, but the use of flash memory is not required or limited as any type of memory and/or data storage structure can be optimized by the assorted aspects of this disclosure.

Figure 1:
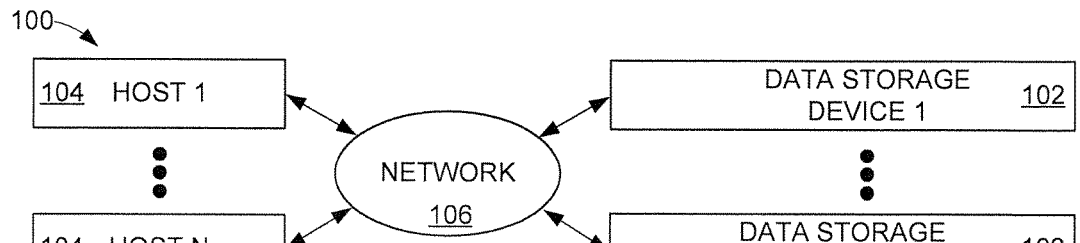
FIG. 1 displays a block representation of an example data storage system in which various embodiments may be practiced.

In FIG. 1, a block representation of an example data storage system 100 is displayed. The data storage system 100 can consist of any number of data storage devices 102 connected to any number of hosts 104 via a wired and/or wireless network 106. It is contemplated that a variety of data storage devices 102 can be utilized with different types of memory and varying performance characteristics, such as capacity, data access latency, and physical size. The various hosts 104 can also be different types of computing devices with different computing capabilities. For example, a first host can be a server while a second host is a network node and a third host is a virtual machine that are each located at different physical addresses, such as dissimilar states, and operate with different purpose and structure.

The network 106 may consist of one or more circuits, switches, routers, and distribution means that can transfer data signals to, and from, the respective data storage devices 102. In some embodiments, the network 106 is arranged as a redundant array of independent devices (RAID) with at least one network controller directs data to multiple data storage devices concurrently, or sequentially, when engaging in striping and/or mirroring operations along with the generation and distribution of parity information about data being stored in the data storage device(s) 102.

Figure 2:
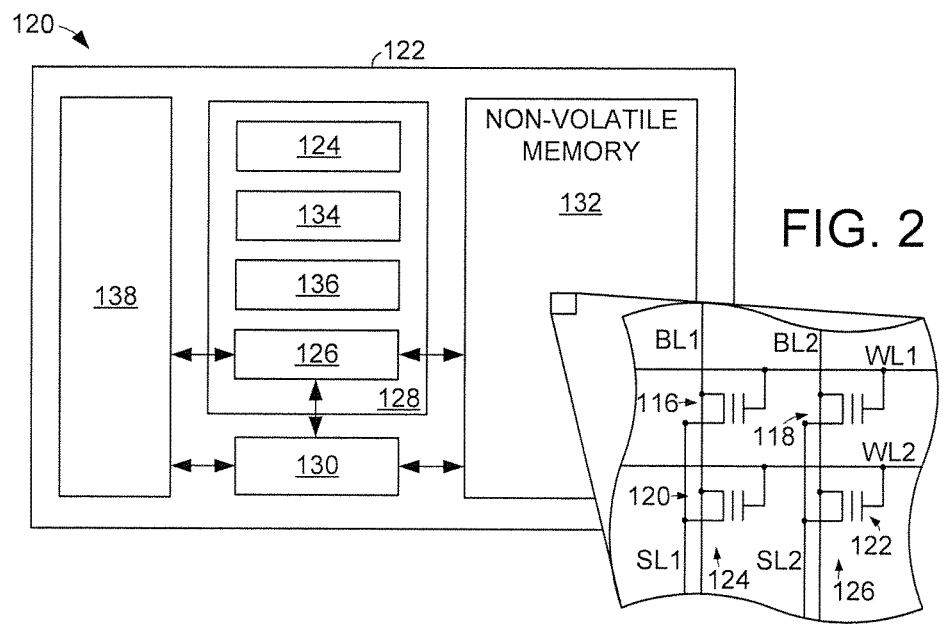
FIG. 2 is a block representation of portions of an example data storage device capable of being utilized in the data storage system of FIG. 1

FIG. 2 conveys a block representation of an example data storage device 120 that can be used in the data storage system 100 of FIG. 1 in accordance with some embodiments. The data storage device 120 can be contained within a single housing 122, which may be sealed or unsealed and may be incorporated into a larger physical structure, such as into a data enclosure as part of a data rack.

One or more controllers 124 can be contained in the housing and connected to at least one memory buffer. In the non-limiting embodiment shown in FIG. 2, the data storage device 120 connects a local controller 124, such as a programmable processor or microprocessor, to a static random access memory (SRAM) buffer 126 on a common wafer chip 128, which can be characterized as an on-chip buffer. The local controller 124 can also be connected to one or more off-chip buffers 130, such as a dynamic random access (DRAM) buffer. The on-chip buffer 126 can have faster data access speed than the off-chip buffer 130, due to fewer channel and protocol restrictions, but much lower capacity due to the physical size constraints of the wafer chip 128. Hence, the local controller 124 can selectively utilize the on-chip 126 and off-chip 130 buffers to manage the flow of data into, and out of, the non-volatile memory 132 to optimize performance of the data storage device 120.

The wafer chip 128 may additionally support a compression circuit 134 and an encryption circuit 136 that can individually, and collectively, process data being sent to, and received from, the non-volatile memory 132. The local controller 124 may process, activate, manage, control, and execute the satisfaction of data access requests alone or with other modules of the data storage device 120. One such module can be an error detection module 138 that can partially, or completely, utilize the computing power of the local controller 124 to conduct data processing for the data storage device 120, such as data mapping, data maintenance, garbage collection operations, data writes, data reads, and data updates.

While not required, the error detection module 138 can conduct data testing for error detection as well as generate error detection code in combination with the local, or remote, controller 124 processing and executing the data access request from a remote host. That is, the error detection module 138 can operate to test data and generate error detection information for the data by itself or in combination with other local and remote controllers during the satisfaction of one or more data access requests to the non-volatile memory 132. Hence, the error detection module 138 can contribute to the processing and preparation of data be stored to, and read from, the non-volatile memory 132.

As a non-limiting example of the structure of the non-volatile memory 132, NAND flash memory is partially shown schematically with first (BL1) and second (BL2) bit lines operating with first (WL1) and second (WL2) word lines and first (SL1) and second (SL2) source lines to write and read data stored in first 140, second 142, third 144, and fourth 146 flash cells. It is noted that the respective bit lines correspond with first 148 and second 150 pages of memory that are each the minimum resolution of the memory 132. That is, the construction of the flash memory prevents the flash cells from being individually rewritable in-place and instead are rewritable on a page-by-page basis. Such low data resolution, along with the fact that flash memory wears out after a number of write/rewrite cycles, corresponds with numerous performance bottlenecks and operational inefficiencies compared to memory with cells that are bit addressable.

The structural inefficiencies of flash memory are exacerbated by the compression 134 and encryption 136 circuits that respectively operate to decrease the footprint and increase the security of data in the non-volatile memory 132, but at the cost of larger data access latency and processing needed to service a data read and/or data write. Thus, various embodiments are directed to intelligently providing error detection and correction during the servicing of data access requests while maintaining data compression and security features.

Figure 3:
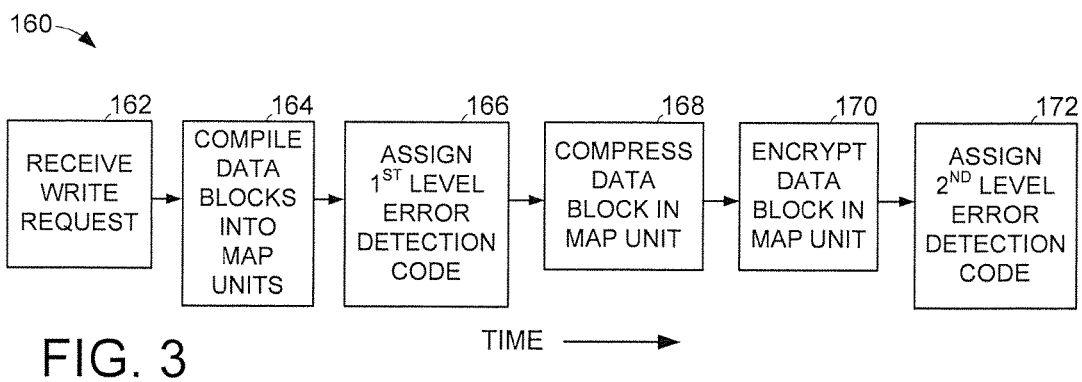
FIG. 3 conveys an example data write scheme that can be executed with the data storage system of FIG. 1 in accordance with various embodiments.

FIG. 3 depicts a block representation of an example data write scheme 160 that can be conducted over time with the data storage system 100 of FIG. 1 and the data storage device 120 of FIG. 2. It is noted that prior to scheme 160 being initiated, a data storage system is present and capable of servicing data access requests from one or more hosts to one or more data storage devices. The issuance of a data write request in step 162 corresponds with data sent to a data storage device that is to be stored in non-volatile memory. The data of the data write request is compiled in step 164 into a map unit. The data block can be characterized as code word that comprises user-generated data along with overhead data, such as offset, status, and error detection information.

The compilation of data into a map unit in step 164 is necessary due to the page being the smallest unit of resolution for data entering, or exiting, flash memory, as controlled by a flash engine and forward table that converts logical data addresses to physical addresses. In other words, data cannot be directly written to a particular address of flash memory and instead is compiled into data blocks/map units/code words that fill at least a page of memory. The processing of the write data in step 164 may concurrently, or sequentially, involve the error detection module assigning a first level error detection code in step 166 that becomes part of the data block. The error detection module can conduct one or more tests and/or evaluations during step 166 to provide an error detection code that allows the data to be identified as altered. It is contemplated that the first level error detection code may consist of multiple codes, tags, or attribute fields that allow for repair of data identified as corrupted.

The generation of the first level error detection code in step 166 can be identified as a front-end code prior to steps 168 and 170 sequentially compressing and encrypting the compiled data block with a compression circuit and an encryption circuit. At the conclusion of step 170 the data block can be identified as a back-end code where the entirety of the data block is compressed and encrypted, such as the user-generated data and overhead data information consisting of the error detection code.

Although the compressed and encrypted data block can be stored in flash memory without any further processing, the data block must be decompressed and decrypted to in order to evaluate the error detection code and the corresponding integrity of the user-generated data of the data block. Such decompression and decrypting can be time consuming and inefficient, particularly in garbage collection operations where out-of-date data blocks in the non-volatile memory are cleared. In fact, encryption may not be possible if a data key is not available during garbage collection operations. In other words, despite having the error first level error detection code as part of the data block, the compression and encryption of the data block prevents the error detection code from being read from the non-volatile memory. Returning to the garbage collection example, a data block of the non-volatile memory cannot be identified as corrupted until it is decompressed and decrypted, which creates a performance bottleneck, particularly for garbage collection operations that are generally conducted in the background while other data access operations and processing operations are being conducted.

Accordingly, assorted embodiments assign a second level error detection code to the data block in step 172 that is not compressed or encrypted. The presence of the second level error detection code allows the error detection module, and local controller, to determine if a data block is corrupted without having to decompress and decrypt the data block. The presence of the first level error detection code allows the second level error detection code to have a relatively small size, such as 2 bytes or less. That is, the first level error detection code can be more robust and sophisticated, such as by having data repair and/or security information, while the second level error detection code simply identifies if a change has been made to the data block. Hence, the first and second level codes can contain different information and be different sizes, but such arrangement is not required as the codes can be the same when uncompressed and not encrypted.

Figure 4:
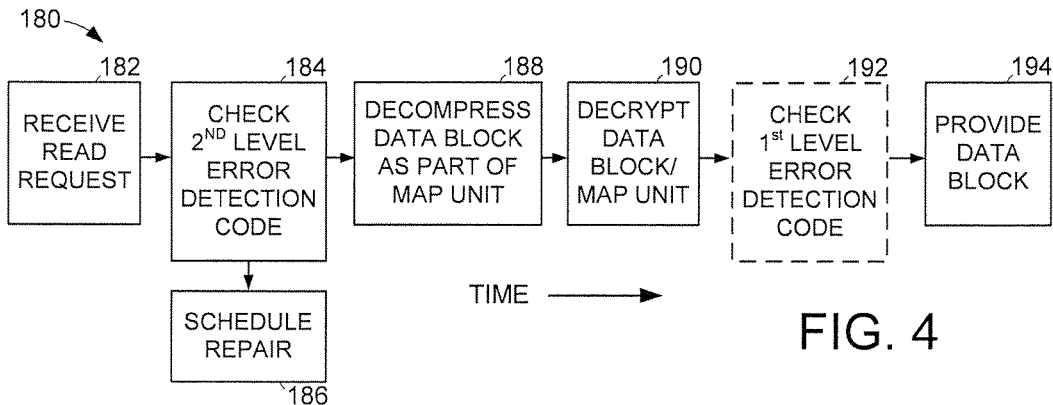
FIG. 4 depicts an example data read scheme that can be carried out with the data storage system of FIG. 1 in accordance with some embodiments.

FIG. 4 represents an example data read scheme 180 that may be carried out with the data storage system 100 of FIG. 1 and at least one data storage device 120 of FIG. 2 in accordance with some embodiments. The scheme 180 begins with a data read request from a host being received in step 182. The data read request is for one or more data blocks that are stored in the non-volatile memory of the data storage device. The stored data block is compressed and encrypted and consists of at least user-generated data and a back-end first level error detection code. A second level error detection code corresponding to the stored data block and stored in the non-volatile memory is read in step 184 to identify if the data block has been modified and/or corrupted.

The local controller and error detection module can respond to a corrupted data block by conducting, or scheduling, repair of portions of the data block in step 186. Such repair operations can be done solely by the error detection module alone, or in combination with evaluating other data blocks in the service of data access requests. At the end of repairing a data block in step 186, during such a repair, or if no repair is deemed necessary from step 184, the data block(s) requested from the host are retrieved from the non-volatile memory and sequentially decompressed in step 188 and decrypted in step 190.

The decompression and decryption of the requested data block(s) allows step 192 to check the first level error correction code of each data block, which is a front-end first level code due to steps 188 and 190. By checking the first level error detection code after the second level error detection code the integrity of the user generated data of the data block can be verified. However, it is contemplated that step 192 is skipped, as illustrated by segmented line around step 192, due to the second level code previously identifying if the data block is altered and/or corrupted. Regardless of whether step 192 is executed, scheme 180 provides the data block(s) to a host in step 194 to satisfy the data access request. In some embodiments, step 194 can update the data of the data block before, after, or in place of providing the data block(s) to the host. As such, scheme 180 could be characterized as a For clarity, various, non-limiting examples of data block reads will be discussed. For instance, if the second level code represents more than data block, step 192 can be conducted to identify if it is that particular data block that has been altered. As another instance, the error detection module can redundantly check the first and second level codes for a single data block to evaluate if an error has occurred during the compression/decompression and encryption/decryption by the respective compression and encryption circuits.

Figure 5:
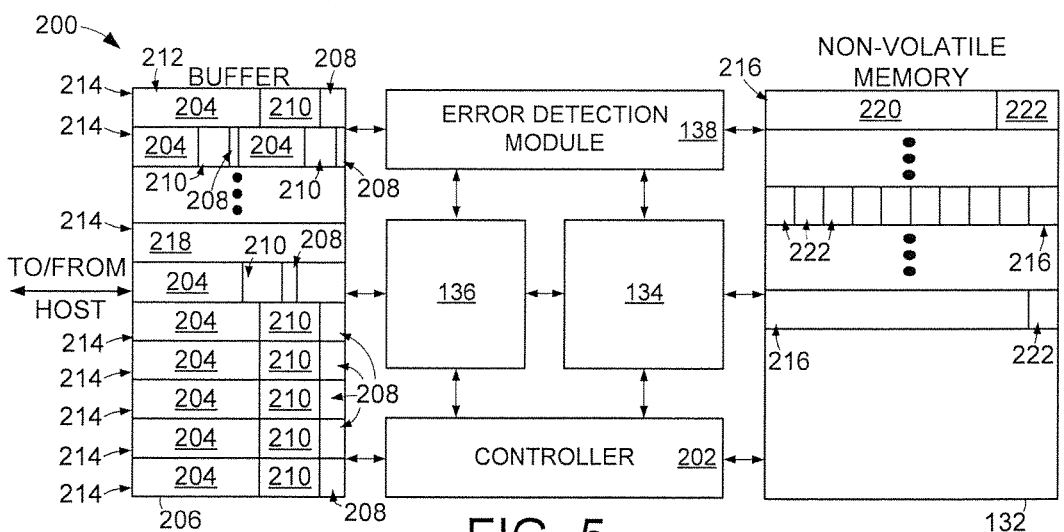
FIG. 5 shows a block representation of portions of an example data storage system configured and operated in accordance with assorted embodiments.

FIG. 5 is a block representation of portions of an example data storage system 200 configured and operated in accordance with various embodiments. As data access requests are serviced by the error detection module 138 and access controller 202, user-generated data 204 enters a memory buffer 206, such as buffer 126 or 130 of FIG. 2. The buffer 206 and access controller 202 may respectively be located in a data storage device, or in a network computing device, such as part of the network 106, or connected to a data storage device via wired and/or wireless interconnections.

Irrespective of the physical location of buffer 206, the user-generated data 204 may be processed by the error detection module 138 and controller 202 to assign various parameters, such as a logical block address (LBA), physical block address (PBA), data offset value, status value, and back-end first level error detection code 208. As shown, the LBA, PBA, offset value, and status value parameters are collectively characterized as overhead data 210 that can consist of one or more measured and/or assigned values. The LBA values can be sequential from a minimum value to a maximum value (e.g., from LBA 0 to LBA N with N being some large number determined by the overall data capacity of the SSD).

An offset value can correspond with a bit offset along a selected page of memory while the status value may indicate the status of the associated data (e.g., valid, invalid, null, etc.). The combination of the user-generated data 204, overhead data 210, and first level error correction code can be identified as a data block, map unit, code word, or data string 212. Other logical addressing schemes can be used such as key-values, virtual block addresses, etc.

Temporary storage of the user-generated data 204 in the buffer 206 allows the generation of the overhead data 210 and the error detection code 208 as well as the compilation of multiple data blocks into the various pages 214 of the buffer 206. It is contemplated that each buffer page 214 is a size, such as 16 kilobytes, that matches the size of each memory page 216, but the buffer pages 214 may alternatively be a different size than the memory pages 216. That way, data blocks 212 can be organized to efficiently fit into the size of the memory pages 214/216 by the controller 202 in combination with the error detection module 138.

It is contemplated that the data blocks 212 of the buffer 206 are organized into the buffer pages 214 with the compressed block size in mind. That is, the controller 202 can predict the compressed size of the data block 212 and organize the data blocks 212 in the buffer pages 214 so that the data block 212 after compression will optimally occupy the memory pages 216 with as minimal unused memory space as possible. It is possible that a buffer page 214 may be left empty, such as page 218.

Assorted embodiments can selectively utilize more than one buffer 204, such as in a hierarchical structure. In embodiments where on-chip SRAM buffer is employed, the controller 202 may organize data blocks 212 and conduct buffering operations in an attempt to keep the SRAM buffer full, which allows the faster data transfer speed of on-chip buffer to be realized. It is contemplated that the controller 202 can individually, sequentially, or collectively send buffer pages 214, and the data block(s) 212 stored therein, through the compression 134 and encryption 136 circuits. In other words, the controller 202 may wait until the buffer 206 is full of pending data blocks 212 or send one or more individual buffer pages 214 to the compression 134 and encryption 136 circuits.

Once data blocks are compressed and encrypted, the controller 202 directs storage of the downstream data blocks 220 in the various memory pages 216. It is noted that downstream data blocks 218 are compressed and encrypted versions of the upstream data blocks 212 and consist of at least user-generated data and a back-end first level error correction code. The controller 202 can position multiple data blocks 220 in a single memory page 216 or write a single data block 220 per page 216. The ability to organize downstream data blocks 220 into various page configurations allows the controller 202 to optimize the available memory 132 space as well as the processing time associated with writing the pages 216 to the memory, such as after a page reset associated with flash memory.

At any time after compression and encryption of a data block 218, the error detection module 138 can generate a second level error correction code 222. The second level error detection code 222 can correspond to any number of data blocks 220. For instance, a second level code 222 can identify a single block 220 or a plurality of blocks 220. The second level error correction code 222 may be positioned proximal to an associated data block 220, such as sequentially after, or may be located in other parts of the non-volatile memory 132. As a non-limiting example, a memory page 216 may store different second level error correction codes corresponding to different downstream data blocks 220. Another example stores a single second level error detection code 222 in the memory 132 that corresponds with all the stored data blocks 220 throughout the various pages 216. It is contemplated that a second level error correction code 22 may be generated for each particular die or plane of flash memory.

The use of a single second level error detection code 222 for the entire non-volatile memory 132 can provide a hierarchical structure with the first level error correction code 208. In response to a data access request, the error detection module 138 can poll the second level error detection code 222 to identify if a change has been made to any constituent downstream data block 220 before decrypting and decompressing one or more memory pages 216. That is, the ability to quickly identify if a memory page/die/plane has been altered, based on the resolution of the second level error correction code 222, allows the controller 202 to efficiently locate stale data blocks for garbage collection operations without having to decrypt and decompress every memory page 216.

With the error detection module 138 acting in concert with the controller 202, the status of data stored in the non-volatile memory 132 can be quickly polled to allow data access and maintenance operations to be optimized. Instead of moving a memory page 216 through the decryption 136 and compression 134 circuits to determine the status of data, the second level error correction code 222 provides immediate feedback on the status of one or more memory pages 216 that can be used to increase data access performance and decrease the processing and time draw of background operations, such as garbage collection carried out by the controller 202.

Figure 6:
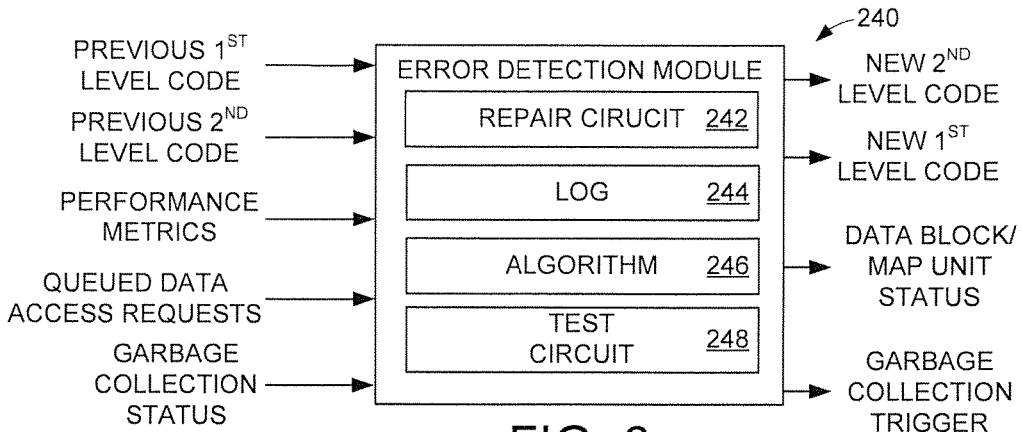
FIG. 6 represents an example error detection module that may be employed in a data storage system in accordance with various embodiments.

FIG. 6 displays a block representation of an example error detection module 240 that can be employed in a data storage system in accordance with various embodiments. The error detection module 240 may utilize local, or remote, controllers to process inputs and generate first and second level error correction codes along with identifying the status of a data block and triggering garbage collection operations for the non-volatile memory.

Although not required or limiting, the error detection module 240 can consist of at least a repair circuit 242, a log 244, an error detection algorithm 246, and a test circuit 248. The repair circuit 242 can respond to the test circuit 248 identifying a data block contains an error by rebuilding some, or all, of the data block. In some embodiments, the test circuit 248 and repair circuit 242 can operate proactively to correct forecasted data block errors that have not occurred yet, such as encryption, compression, or memory wear.

The error detection module 240 can maintain one or more temporary, or permanent, logs 244 where the first and second level error detection codes are stored. The logged codes allows the error detection module 240 to quickly compare received first and second level error correction codes to current codes to determine if a data block has been changed/corrupted. Maintenance of a log 244 may further allow the error correction module 240 to detect trends and patterns that allow the module 240 to predict future activity with high accuracy. For instance, finding consecutive data blocks with an error can trigger the error detection module 240 to forecast the next physical, or logical, address will have an error, which can be proactively compensated for by scheduling a repair operation and/or pre-fetching the address into buffer memory without a corresponding access request.

The error detection module 240 can intake a number of diverse parameters that result in robust evaluation of current system conditions and proactive capabilities. The use of one or more algorithms 246 by the error detection module 240 can concurrently, and independently, process various current conditions, such as system and device performance metrics, the number and volume of queued data access requests, and the status of garbage collection activity, to determine if a new first level error correction code is to be generated, a new second level error correction code is to be generated, or garbage collection operations are to begin. The ability to evaluate the status of one or more data blocks, such as a memory page, die, or plane, provides intelligence to the error detection module 240 that can optimize the servicing of data access requests as well as the timing of garbage collection activity with respect to the reading of the respective first and second level error detection codes.

In some embodiments, a single algorithm 246 is employed by the error detection module 240 to generate the respective first and second level error detection codes. However, other embodiments utilize multiple different algorithms 246 to generate the first and second level error detection codes. It is contemplated that the error detection module 240 can intelligently select between multiple different algorithms 246 based on the current and/or predicted system/device status, which can focus on a single performance metric, such as data access latency or error rate. As a non-limiting example, the error detection module 240 can identify a potential, or current, performance bottleneck that triggers the test circuit 248 to further evaluate the bottleneck and allows the module 240 to select the most efficient algorithm 246 to create first and/or second level error detection codes that mitigate the effects of the performance bottleneck.

Figure 7:
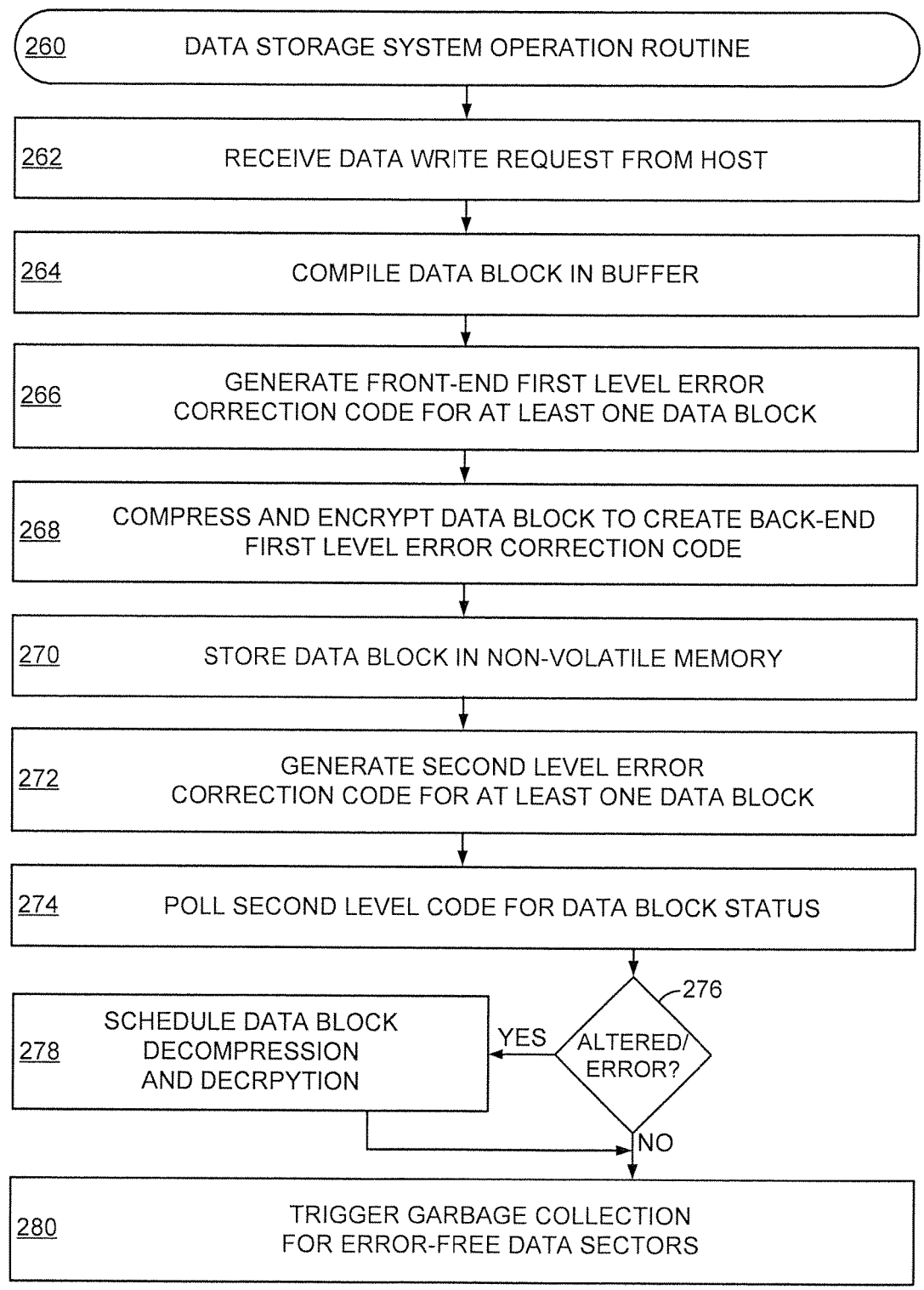
FIG. 7 provides a flowchart of an example data storage system operation routine that can be executed by the data storage system of FIG. 1 in accordance with some embodiments.

FIG. 7 is a flowchart of an example data storage system operation routine 260 that can be carried out with the various embodiments conveyed in FIGS. 1-6. The routine 260 may begin with step 262 receiving at least one data write request from a host. It is contemplated that step 262 can concurrently, and sequentially, receive other types of data access requests, such as data reads or garbage collection, from any number of local and remote hosts. Receipt of a data write request causes step 264 to compile the user-generated data of the data write request into a data block in a buffer memory. The compilation of the data block in step 264 may involve a controller and/or error detection module calculating and/or assigning data overhead parameters, such as data offset and status values.

Storage of the user-generated data of the data write request along with any overhead data from step 264 allows step 266 to generate a front-end first level error correction code for the data block. Step 266 may involve the error detection module using a single algorithm, or multiple algorithms, to compute the user-generated data alone, or in combination with any overhead data. As such, the user-generated data is compiled in the buffer memory into a data block that has a front-end first level error detection code and may have overhead data. It is noted that multiple compiled data blocks can be organized into a single buffer page that corresponds with a single page of non-volatile memory.

At some time after a data block is compiled in the buffer, step 268 sends at least one data block through compression and encryption circuits. A single data block, a page of multiple data blocks, or the entirety of the buffer memory can be individually, or collectively, compressed and encrypted in step 268 to generate a single data block stored in the non-volatile memory in step 270. The ability to compress and encrypt multiple buffer data blocks into a single memory data block efficiently utilizes the available storage capacity of the non-volatile memory while providing error detection in the form of the, now back-end, error correction code. It is contemplated that a single memory data block can comprise multiple, now back-end, first level error detection codes that respectively correspond with different buffer data blocks.

For clarity, the compression and encryption of a buffer data block into a memory data block is completely reversible, given the correct compression scheme and encryption algorithm. As an example, multiple buffer data blocks, each with a different front-end error detection code, can be compressed and encrypted into a single memory page that has one or more back-end first level error detection codes that can be decompressed and decrypted at any time to regenerate the multiple buffer data blocks and respective front-end first level error detection codes.

The storage of a memory data block in the non-volatile memory prompts the error detection module to generate a second level error correction code in step 272. With each memory data block having a back-end first level error detection code and a second level error detection code, any number of data access operations can be conducted for any amount of time. At a scheduled or prompted time after step 272, step 274 can poll the second level error detection code for a memory data block status. The polling of step 274 can be initiated by the error detection module and can compare a logged second level code for the particular memory data block with the currently polled code to determine if the codes are different, which can indicate the memory data block has been altered or an error has occurred.

Decision 276 evaluates if the current and previous second level error correction codes for a memory data block are different. If different, a change and/or error has occurred and step 278 schedules the memory data block for decompression and decryption in order to find, correct, or handle the altered data. In the event a data access request is directed to a memory data block having an error/change indicated by the second level error detection code, the error detection module may schedule test and/or repair circuits in step 278 to identify and correct any errors in order to return uncorrupted data to service the access request.

If decision 276 does not find an error/change to a memory data block, step 280 triggers the memory data block for future or current garbage collection operations. It is contemplated that garbage collection operations can be conducted in step 280 even if a data block has an error. By ensuring a memory data block is error free and has not been altered via polling the second level error detection code, the data storage system can efficiently conduct data access and garbage collection operations to only error free blocks. A value of the second level error detection code is for debugging firmware during garbage collection operations. In contrast, without the second level error detection code, each memory data block would need to be decompressed and decrypted to determine if the data has been altered or contains an error. Hence, the use of the second level error detection code in combination with a first level error detection code provides optimized data block status polling that allows for efficient scheduling of test and repair operations along with optimized garbage collection of data blocks that are error free.

Through the assorted embodiments of FIGS. 1-7, an error detection module provides intelligence for a data storage system that can mitigate and/or eliminate performance bottlenecks associated with managing data in a non-volatile memory. The error detection module provides complementing first and second level error detection codes that allow for efficient data block status polling despite data blocks being compressed and encrypted in the non-volatile memory.

What is claimed is:

1. A method comprising:
   activating a data storage device having a non-volatile memory, a memory buffer, and an error detection module,
   storing a buffer data block in the memory buffer;
   assigning a front-end first-level error detection code to the buffer data block with the error detection module;
   compressing the buffer data block with a compression circuit of the data storage device;
   encrypting the buffer data block with an encryption circuit of the data storage device to create a memory data block, the compression and encryption of the front-end first-level error detection code creating a back-end first-level error detection code;
   storing the memory data block and back-end first-level error detection code in the non-volatile memory; and
   assigning a second-level error detection code to the memory data block with the error detection module, the second-level error detection code being uncompressed and unencrypted.

2. The method of claim 1, wherein the buffer data block is different than the memory data block.

3. The method of claim 1, wherein the memory data block comprises multiple buffer data blocks.

4. The method of claim 1, wherein each buffer data block comprises overhead data.

5. The method of claim 4, wherein the overhead data comprises an offset value and a status value.

6. The method of claim 1, wherein the second level error detection code represents multiple different memory data blocks.

7. The method of claim 1, wherein the second level error correction code is stored alone in a memory page of the non-volatile memory.

8. The method of claim 1, wherein the second level error correction code is stored in a consecutive address with the memory data block.

9. A method comprising:
   activating a data storage device having a non-volatile memory, a memory buffer, and an error detection module,
   storing first, second, and third buffer data blocks in the memory buffer;
   assigning a front-end first-level error detection code to each buffer data block with the error detection module;
   compressing each buffer data block with a compression circuit of the data storage device;
   encrypting each buffer data block with an encryption circuit of the data storage device to create a memory data block, the compression and encryption of the front-end first-level error detection code creating a back-end first-level error detection code;
   storing the memory data block and back-end first-level error detection code in the non-volatile memory;
   assigning a second-level error detection code to the memory data block with the error detection module, the second-level error detection code being uncompressed and unencrypted;
   checking the second-level error detection code with the error detection module in response to a data read request for the memory data block; and
   polling the front-end first-level error detection code of the first buffer data block in response to the second-level error detection code identifying no error in the memory data block.

10. The method of claim 9, wherein the error detection module decompresses the memory data block with the compression circuit and decrypts the memory data block with the encryption circuit prior to polling the front-end first-level error detection code of the first buffer data block.

11. The method of claim 9, wherein the error detection module compiles the first and second buffer data blocks into a single buffer page prior to the compressing step.

12. The method of claim 9, wherein the second-level second error detection code identifies a collective status of the first, second, and third buffer data blocks.

13. The method of claim 9, wherein each buffer data block occupies a different buffer page.

14. The method of claim 9, wherein the error detection module schedules at least one buffer data block to be tested with a test circuit and repaired with a repair circuit in response to the second level error detection code not matching a logged second-level error detection code.

15. An apparatus comprising:
  a data storage device having a non-volatile memory;
  a memory buffer; and
  an error detection module, the memory buffer storing a first data block comprising a front-end first-level error detection code assigned by the error detection module, the non-volatile memory comprising a second data block comprising a back-end first-level error detection code and a second-level error detection code each assigned by the error detection module, the second-level error detection code being uncompressed and unencrypted.

16. The apparatus of claim 15, wherein the memory buffer, error detection module, and a local device controller are each physically positioned on a single wafer chip.

17. The apparatus of claim 15, wherein the memory buffer is volatile.

18. The apparatus of claim 15, wherein the data storage device comprises a compression circuit and an encryption circuit connected between the memory buffer and the non-volatile memory.

19. The apparatus of claim 15, wherein the second-level error detection code has a size of 2 bytes.

20. The apparatus of claim 15, wherein the front-end first-level error detection code is uncompressed and unencrypted and the back-end first-level error detection code is compressed and encrypted.

\* \* \* \* \*

UNITED STATES PATENT AND TRADEMARK OFFICE
CERTIFICATE OF CORRECTION

PATENT NO. : 10,176,886 B1
APPLICATION NO. : 15/643550
DATED : January 8, 2019
INVENTOR(S) : Thomas V. Spencer, Ryam James Goss and Mark A. Gaertner Page 1 of 1

It is certified that error appears in the above-identified patent and that said Letters Patent is hereby corrected as shown below:

In the Claims

In Column 11, Line 10:
Delete "second"

Signed and Sealed this
Nineteenth Day of March, 2019

Andrei Iancu
*Director of the United States Patent and Trademark Office*